US011404130B1

(12) United States Patent
Gajera et al.

(10) Patent No.: US 11,404,130 B1
(45) Date of Patent: Aug. 2, 2022

(54) EVALUATION OF BACKGROUND LEAKAGE TO SELECT WRITE VOLTAGE IN MEMORY DEVICES

(71) Applicant: Micron Technology, Inc., Boise, ID (US)

(72) Inventors: Nevil N. Gajera, Meridian, ID (US); Karthik Sarpatwari, Boise, ID (US); Zhongyuan Lu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/167,618

(22) Filed: Feb. 4, 2021

(51) Int. Cl.
*G11C 16/10* (2006.01)
*G11C 16/34* (2006.01)
*G11C 16/26* (2006.01)
*G11C 16/30* (2006.01)

(52) U.S. Cl.
CPC .......... *G11C 16/3404* (2013.01); *G11C 16/10* (2013.01); *G11C 16/26* (2013.01); *G11C 16/30* (2013.01); *G11C 16/3459* (2013.01)

(58) Field of Classification Search
CPC ..... G11C 16/3404; G11C 16/10; G11C 16/26; G11C 16/30; G11C 16/3459
See application file for complete search history.

(56) References Cited

U.S. PATENT DOCUMENTS

| 11,004,525 | B1* | 5/2021 | Gautam | G11C 16/3495 |
|---|---|---|---|---|
| 2012/0008410 | A1 | 1/2012 | Huynh et al. | |
| 2013/0229868 | A1 | 9/2013 | Koh et al. | |
| 2014/0104925 | A1 | 4/2014 | Azuma et al. | |
| 2018/0204614 | A1 | 7/2018 | Hahn et al. | |
| 2019/0139591 | A1 | 5/2019 | Wang et al. | |

OTHER PUBLICATIONS

International Search Report and Written Opinion, PCT/US2022/013913, dated May 4, 2022.

\* cited by examiner

*Primary Examiner* — Xiaochun L Chen
(74) *Attorney, Agent, or Firm* — Greenberg Traurig

(57) ABSTRACT

Systems, methods, and apparatus related to memory devices. In one approach, a memory device has a memory array including memory cells. A controller of the memory device evaluates background leakage in order to select a write voltage to apply to a memory cell when performing a programming operation. The write voltage is dynamically selected from two or more write voltages. These write voltages include a first write voltage that is a normal or default voltage, and a second write voltage that is a boosted write voltage. The controller applies a pre-sensing voltage and pre-read voltage to the memory cell, and determines first and second respective currents that result from applying these voltages. In response to determining that the first current exceeds a first threshold (indicating background leakage), and the second current is below a second threshold that is greater than the first threshold (indicating that the memory cell does not snap), the controller selects the second (boosted) write voltage.

20 Claims, 6 Drawing Sheets

EVALUATION OF BACKGROUND LEAKAGE TO SELECT WRITE VOLTAGE IN MEMORY DEVICES

FIELD OF THE TECHNOLOGY

At least some embodiments disclosed herein relate to memory devices in general, and more particularly, but not limited to memory devices that evaluate background leakage to select write voltages for applying to memory cells when performing write operations.

BACKGROUND

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory cells may maintain their stored logic state for extended periods of time even in the absence of an external power source. Volatile memory cells may lose their stored state over time unless they are periodically refreshed by an external power source.

A storage device is an example of a memory device. Typical computer storage devices have controllers that receive data access requests from host computers and perform programmed computing tasks to implement the requests in ways that may be specific to the media and structure configured in the storage devices. In one example, a memory controller manages data stored in memory and communicates with a computer device. In some examples, memory controllers are used in solid state drives for use in mobile devices or laptops, or media used in digital cameras.

Firmware can be used to operate a memory controller for a particular storage device. In one example, when a computer system or device reads data from or writes data to a memory device, it communicates with the memory controller.

Memory devices typically store data in memory cells. In some cases, memory cells exhibit non-uniform, variable electrical characteristics that may originate from various factors including statistical process variations, cycling events (e.g., read or write operations on the memory cells), or a drift (e.g., a change in resistance of a chalcogenide alloy), among others.

In one example, reading a set of data (e.g., a codeword, a page) is carried out by determining a read voltage (e.g., an estimated median of threshold voltages) of memory cells that store the set of data. In some cases, a memory device may include an array of PCM cells arranged in a 3D architecture, such as a cross-point architecture to store the set of data. PCM cells in a cross-point architecture may represent a first logic state (e.g., a logic 1, a SET state) associated with a first set of threshold voltages, or a second logic state (e.g., a logic 0, a RESET state) associated with a second set of threshold voltages. In some cases, data may be stored using encoding (e.g., error correction coding (ECC)) to recover data from errors in the data stored in the memory cells.

For resistance variable memory cells (e.g., PCM cells), one of a number of states (e.g., resistance states) can be set. For example, a single level cell (SLC) may be programmed to one of two states (e.g., logic 1 or 0), which can depend on whether the cell is programmed to a resistance above or below a particular level. As an additional example, various resistance variable memory cells can be programmed to one of multiple different states corresponding to multiple data states, e.g., 10, 01, 00, 11, 111, 101, 100, 1010, 1111, 0101, 0001, etc. Such cells may be referred to as multi state cells, multi-digit cells, and/or multilevel cells (MLCs).

The state of a resistance variable memory cell can be determined (e.g., read) by sensing current through the cell responsive to an applied interrogation voltage. The sensed current, which varies based on the resistance of the cell, can indicate the state of the cell (e.g., the binary data stored by the cell). The resistance of a programmed resistance variable memory cell can drift (e.g., shift) over time. Resistance drift can result in erroneous sensing of a resistance variable memory cell (e.g., a determination that the cell is in a state other than that to which it was programmed, among other issues).

A PCM cell, for example, may be programmed to a reset state (amorphous state) or a set state (crystalline state). A reset pulse (e.g., a pulse used to program a cell to a reset state) can include a relatively high current pulse applied to the cell for a relatively short period of time such that the phase change material of the cell melts and rapidly cools, resulting in a relatively small amount of crystallization. Conversely, a set pulse (e.g., a pulse used to program a cell to a set state) can include a relatively lower current pulse applied to the cell for a relatively longer time interval and with a slower quenching speed, which results in an increased crystallization of the phase change material.

A programming signal can be applied to a selected memory cell to program the cell to a target state. A read signal can be applied to a selected memory cell to read the cell (e.g., to determine the state of the cell). The programming signal and the read signal can be current and/or voltage pulses, for example.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
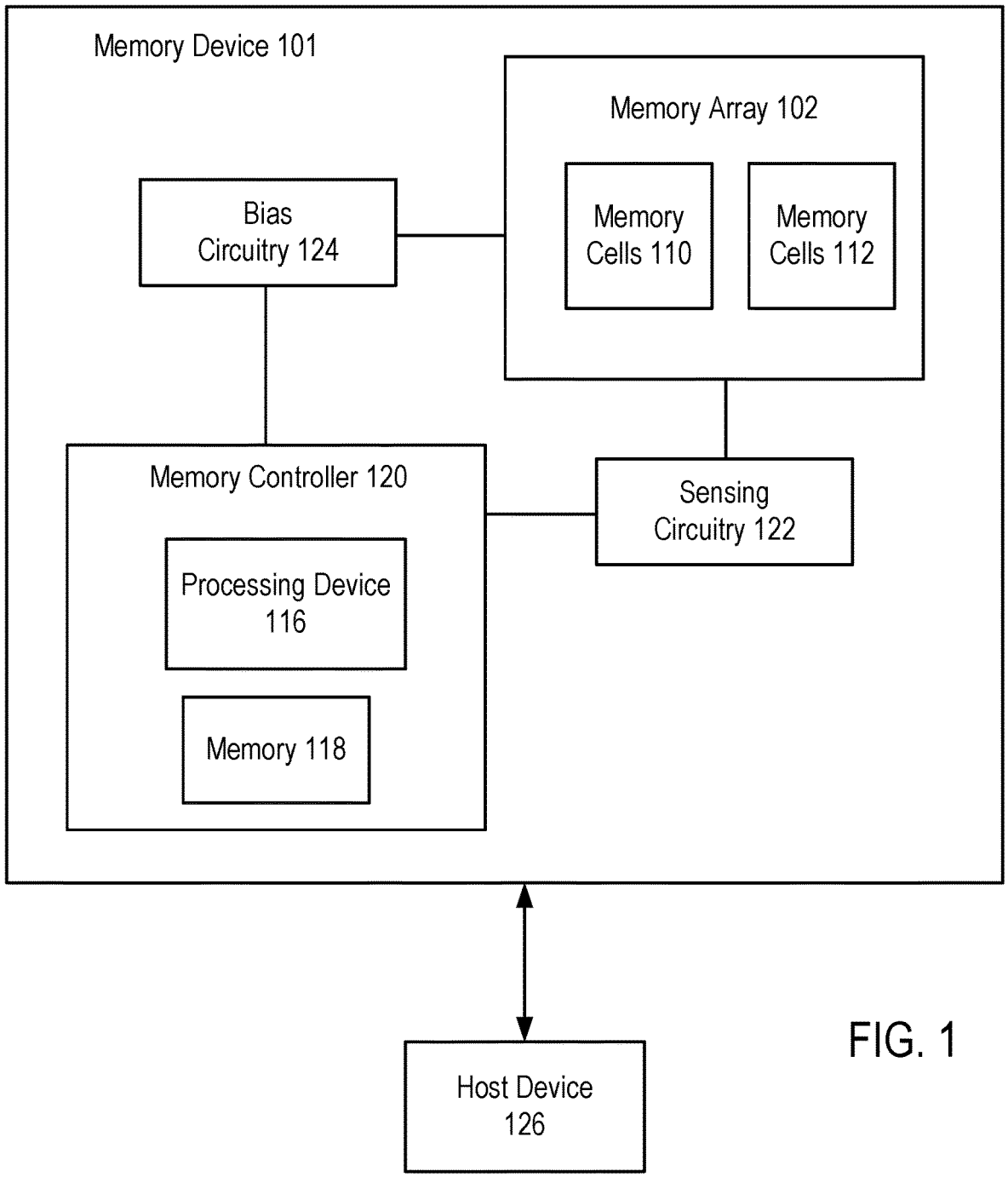
FIG. 1 shows a memory device that evaluates background leakage to select write voltages for applying to memory cells when performing write operations, in accordance with some embodiments.

The following disclosure describes various embodiments for memory devices that evaluate background leakage to select write voltages for applying to memory cells when performing write operations. At least some embodiments herein relate to memory devices that exhibit background leakage due to leakage caused by memory cells of a memory array other than the target memory cell to be programmed.

In some cases, a memory device may include an array of memory cells arranged in a 3D architecture, such as a cross-point architecture to store the set of data. The memory cells in a cross-point architecture may represent a first logic state (e.g., a logic 1, a SET state) associated with a first set of threshold voltages, or a second logic state (e.g., a logic 0, a RESET state) associated with a second set of threshold voltages.

In one example, the memory device stores data used by a host device (e.g., a computing device of an autonomous vehicle, or another computing device that accesses data stored in the memory device). In one example, the memory device is a solid-state drive mounted in an electric vehicle.

In one example, a memory device that exhibits background leakage uses bipolar operations for the memory array. In one example, bipolar select voltages are used to select memory cells of the memory array. In one example, memory cells of the memory device are arranged in a cross-point architecture. In one example, each memory cell is formed using a single select device. In one example, the select device includes a chalcogenide material. Other types of memory devices may exhibit background leakage.

Background leakage can negatively affect write operations by requiring a higher write voltage to offset losses due to the background leakage. In one example, the background leakage is caused by memory cells that share the same word line and/or bit line with a target memory cell to be programmed. The background leakage is the sum of the sub-threshold currents of the background memory cells (cells other than the target cell) that occur when biasing the shared word line and/or bit line with the target cell.

Background leakage may be caused, for example, by any of a number of various reasons. In some cases, memory cells are in good operating condition, but many of the cells are in a SET state with low threshold voltages, so the sum of the subthreshold currents is high (and may negatively impact the reliability of write operations by increasing write errors). In other cases, some memory cells are relatively "short" (e.g., more conductive due to defects and/or other reasons). These cells have high subthreshold current, or in some cases may even be snapped by a partial bias applied to the word line or bit line. Such cells can contribute significantly to leakage current that impacts the main sensing circuit.

In one example, a large number of memory cells that are background to a target bit have been written by a programming operation to be in a SET state, with a low threshold voltage. This can cause high background leakage when programming the target bit. As a result, the write voltage needs to be higher (e.g., to program a target bit that is in a RESET state with a high threshold voltage that requires a high write voltage to overcome the high background leakage). But using a static or fixed high write voltage as the default voltage for programming all target bits in a memory array is wasteful of power as most of the target bits typically can be reliably programmed using a lower write voltage.

In one example, a memory device includes a stacked memory array. As the extent of stacking increases and/or there is increased lateral scaling with a greater number of bits sharing the same electrical lines, the background leakage can become significant. In addition, the background leakage can vary significantly between a severe corner case (most challenging target bits to program), versus a more optimistic case (more typical target bits that are easier to program). The severe corner case may correspond to operating on target bits after all or most of the related background memory cells have been refreshed (e.g., rewritten to a low threshold voltage SET state, so that the leakage current through each background memory cell is high). The optimistic case may correspond to passage of a significant time period in which the background memory cells drift, which results in an increased threshold voltage. In order to cover the corner case when using a static write voltage, a relatively "strong" selection/write strength is needed to handle current delivery concerns caused by the background leakage. However, this creates the technical problem of wasting power because in most cases of programming typical target memory cells, the conditions of the severe corner case do not apply.

In light of the above, background leakage presents a technical problem in which a higher write voltage must be applied to bias word lines and/or bit lines in order to overcome the background leakage and perform successful write operations with acceptable error rates. This can require use of a high static/fixed write voltage. However, using a higher write voltage wastes power as the higher write voltage is only occasionally needed for covering corner cases in which background leakage is high. If the background leakage is lower, as typically applies for most target memory cells in a memory array, than the higher static write voltage causes excessive and unnecessary power consumption by the memory device.

Additionally, in some cases, the above can significantly degrade the endurance and performance of the memory device due to higher voltage cycling of memory cells, which may eventually include failure of the memory device to properly operate. As a result, a system that uses data from the memory device may malfunction. For example, a vehicle using the data for control of the vehicle could crash causing physical damage or physical injury.

To address these and other technical problems, a memory device evaluates background leakage to dynamically select a write voltage for applying to a target memory cell when performing a write operation. In various embodiments, a pre-sensing step is performed in addition to a pre-read step when performing the write operation. The pre-sensing step is used to evaluate the background leakage.

In one embodiment, if the background leakage is determined to meet at least one criteria (e.g., current sensor and/or other collected data associated with leakage is greater than a threshold), a controller of the memory device dynamically boosts the write voltage used to program each target memory cell having leaky background memory cells. The controller is configured to program each of the memory cells in a memory array by applying a write voltage. The controller selects a write voltage for programming based on various criteria, which includes an evaluation of background leakage. The write voltage can be a default voltage that is normally applied to memory cells that do not exhibit significant background leakage. If significant background leakage is determined by the controller, the controller selects a boosted write voltage that has a greater magnitude than the default normal write voltage.

Advantages provided by various embodiments as described herein for a memory device that evaluates background leakage to select write voltage include one or more of the following: Energy consumption by the memory device can be reduced. The memory controller can dynamically customize a magnitude of write voltages applied to memory cells as part of write operations. Bit line write voltages can be reduced for typical cases and only boosted with background leakage above a threshold is determined. Endurance of the memory device can be increased (e.g., due to lower voltage cycling of the memory cells).

In one embodiment, a controller programs each of the memory cells in a memory array by selecting either a first write voltage (e.g., default write voltage) or a second write voltage (e.g., boosted write voltage) to apply to the respective memory cell. The magnitude of the second write voltage is greater than the first write voltage.

When programming a particular first memory cell of the memory array, the controller applies a pre-sensing voltage to the first memory cell. The polarity of the pre-sensing voltage is kept the same as the polarity of the selection/write voltage that follows when the write operation is performed by applying a write voltage to the memory cell. A first current that results from applying the pre-sensing voltage is sensed. The controller determines whether the first current exceeds a first threshold.

The controller applies a pre-read voltage to the first memory cell. Typically, the pre-read voltage is applied after the pre-sensing voltage (but in some cases this order may be reversed). A second current that results from applying the pre-read voltage is sensed. The controller determines whether the second current is below a second threshold that is greater than the first threshold. In response to having determined that the first current exceeds the first threshold (e.g., background is flagged as being potentially leaky), and determining that the second current is below the second threshold (e.g., the target memory cell to be programmed does not snap and is in RESET state), the controller programs the first memory cell by applying the second write voltage.

In one embodiment, a memory device uses a pre-sensing step prior to a pre-read step when performing programming in a normal write mode. In the pre-sensing step, a voltage bias is applied to a memory cell by one or more voltage drivers. A current sensor determines if a resulting current through the memory cell is greater than a target pre-sensing current amplitude. If so, a controller determines that the background potentially has significant leakage. A flag is set in the controller to indicate the potentially high background leakage.

The pre-read step is used to determine the logic state of the memory cell and whether a write operation is needed to change the state of the cell to a new target logic state. A pre-read voltage is applied to the memory cell and a current sensor determines if the resulting current through the memory cell is greater than a target pre-read current amplitude. The target pre-sensing current amplitude above is lower than the target pre-read current amplitude.

Dynamic boosting of the write voltage based on evaluating background leakage as described herein may be performed in both unipolar and bipolar memory devices. In one example of a unipolar memory device, each memory cell comprises a phase change material and a select device, and the memory cells are arranged in a three-dimensional cross-point architecture. In one example of a bipolar memory device, each memory cell includes chalcogenide as part of a select device (SD). In one example, each memory cell further includes a top electrode (e.g., carbon) above the chalcogenide, and a bottom electrode (e.g., carbon) below the chalcogenide.

In one example, a bipolar memory device includes memory cells that each include chalcogenide as a logic storage element. The pre-sensing voltage and the write voltage have the same polarity. In one example, the pre-read voltage has a negative polarity, and the corresponding write voltage has a positive polarity. The pre-sensing voltage and pre-read voltage are applied to each memory cell in a memory array prior to applying the write voltage to program the memory cell as part of a programming operation.

In one example of a bipolar memory device, bipolar read operations can be performed by the memory device. For this device, two cases can each present a corner case in which selection/write strength is boosted to overcome any significant background leakage that is detected. The first case is a SET on RESET write operation, and the second case is a RESET on SET write operation.

In the first case, a target memory cell is currently in a RESET state, and the desired target state is a SET state. A pre-sensing read is performed in the same direction as the SET write pulse. If the resulting current exceeds the pre-sensing current threshold, then a flag is set indicating that the background is potentially leaky. Next, a pre-read voltage is applied to determine the state of the memory cell. In response to the flag being set, and the pre-read returning a logic state of RESET, the controller selects a stronger selection/write voltage to use for programming the memory cell. In contrast, if either the pre-sensing step detects a low current below the threshold, or the pre-read step indicates that the memory cell is already in a SET state, then the controller does not boost the selection/write voltage.

In the second case, a target memory cell is currently in a SET state, and the desired target state is a RESET state. A pre-sensing read is performed in the same direction as the RESET write pulse. If the resulting current exceeds the pre-sensing current threshold, then a flag is set indicating that the background is potentially leaky. Next, a pre-read voltage is applied to determine the state of the memory cell. In response to the flag being set, and the pre-read returning a logic state of SET, the controller selects a stronger selection/write voltage to use for programming the memory cell. In contrast, if either the pre-sensing step detects a low current below the threshold, or the pre-read step indicates that the memory cell is already in a RESET state, then the controller does not boost the selection/write voltage.

FIG. 1 shows a memory device 101 that evaluates background leakage to select write voltages for applying to memory cells 110, 112 of a memory array 102 when performing write operations, in accordance with some embodiments. Memory device 101 has a memory controller 120 that applies pre-sensing voltages and pre-read voltages as part of the write operations, for example as discussed above. Memory controller 120 includes one or more processing devices 116 and memory 118. In one example, memory 118 stores firmware executed by processing device 116 to apply the pre-sensing and pre-read voltages (and also write voltages, as described below).

Memory controller 120 can use bias circuitry 124 to generate voltages for applying the pre-sensing and pre-read voltages. Bias circuitry 124 can also generate voltages for applying write voltages to memory cells 110, 112 as part of programming operations. In one embodiment, bias circuitry 124 is implemented by one or more voltage drivers. Bias circuitry 124 may further be used to generate read voltages for read operations performed on memory array 102 (e.g., in response to a read command from host device 126).

Memory device 101 includes sensing circuitry 122, which is used to sense a state of each memory cell in memory array 102. In one example, sensing circuitry 122 includes current sensors (e.g., sense amplifiers) used to detect a current caused by applying various pre-sensing and pre-read voltages to memory cells in memory array 102. In one example, bias circuitry 124 applies a pre-sensing and a pre-read voltage to memory cells 110. Sensing circuitry 122 senses a current associated with each of the memory cells 110 caused by applying the pre-sensing or pre-read voltage. In one example, the pre-sensing or pre-read voltages are applied as described above.

In one example, if sensing circuitry 122 determines that the respective current resulting from applying a pre-sensing voltage to a memory cell is greater than a fixed threshold (e.g., a predetermined level of current or threshold current), then memory controller 120 determines that the background is potentially leaky and a flag stored in memory 118 is set.

In one example, if sensing circuitry 122 determines that the respective current resulting from applying a pre-read voltage to the memory cell is greater than a respective fixed threshold (e.g., a predetermined level of current or threshold current), then memory controller 120 determines that the memory cell has snapped.

In one embodiment, memory cells 110 and memory cells 112 correspond to different memory types (e.g., single level cell, or triple level cell). In one example, the material used to form a select device of each memory cell is different. The pre-sensing and/or pre-read voltage applied to memory cells 110 corresponds to the material used to form memory cells 110. The pre-sensing and/or pre-read voltage applied to memory cells 112 is different and corresponds to the material used to form memory cells 112.

In one embodiment, memory controller 120 receives a write command from a host device 126. The write command is accompanied by data (e.g., user data of a user of host device 126) to be written to memory array 102. In response to receiving the write command, controller 120 initiates a programming operation by applying pre-sensing and pre-read voltages to memory cells 110. Controller 120 determines respective currents resulting from applying the pre-sensing and pre-read voltages.

Next, controller 120 determines the particular cells of memory cells 110 for which a write voltage is to be applied to program the memory cell. In one embodiment, controller 120 determines whether the existing programming state (e.g., logic state zero) and the target programming state (e.g., logic state zero) for each cell are equal. If the existing and target programming states are equal, then no write voltage is applied (e.g., this is a normal write mode). If the existing and target programming states are different, then a write voltage is applied to that particular memory cell. In one example, the write voltage is 3-8 volts applied across the memory cell by applying voltage biases to the word line and bit line used to select the cell. In one example, in the case of a chalcogenide memory cell, a write voltage of a first polarity is applied to program the cell to a first logic state (e.g., set state), and a write voltage of a second opposite polarity is applied to program the cell to a second, different logic state (e.g., reset state).

In one embodiment, a force write operation is performed in which particular memory cells are programmed to a target programming state without regard to whether the memory cell has snapped or not. In one example, the force write is performed to make the memory cell more robust in its ability to reliably store the target logic state.

In one example, controller 120 may use write voltages (e.g., write pulses) to write a logic state to a memory cell, such as memory cell 110, 112 during the write operation. The write pulses may be applied by providing a first voltage to a bit line and providing a second voltage to a word line to select the memory cell. Circuits coupled to access lines to which memory cells may be coupled may be used to provide the write voltages (e.g., access line drivers included in decoder circuits). The circuits may be controlled by internal control signals provided by a control logic (e.g., controller 120). The resulting voltage applied to the memory cell is the difference between the first and second voltages. The write pulses may be the same duration as read pulses in some embodiments. In some embodiments the duration is 10-50 ns. In some embodiments, the duration is 1-100 ns. In some embodiments, the duration is 1 ns to 1 microsecond. Writing to the memory cell may take the same time as reading the memory cell in some embodiments.

In one example, the polarity of the write pulses may be either a first polarity or a second polarity (e.g., forward or reverse). For example, a write pulse may apply a voltage to a memory cell in a first polarity (e.g., bit line at 6V and word line at 0V).

In one example, circuits coupled to access lines to which memory cells may be coupled are used to provide read pulses (e.g., access line drivers included in decoder circuits). The circuits may be controlled by internal control signals provided by a control logic (e.g., controller 120). A read voltage or pulse may be a voltage applied to a memory cell for a period of time (e.g., 10-50 ns, 1-100 ns, 1 ns to 1 microsecond). In some embodiments, the read pulse may be a square pulse. In some embodiments, the read pulse may be a ramp, that is, a linearly-increasing voltage may be applied across the memory cell.

In one example, for chalcogenide memory cells, the read voltages are always be applied with the same fixed polarity. In one example, the pre-read voltages have the same polarity, and the polarity of the read voltages is opposite to the pre-read voltages.

In one example, a pre-read step is performed after a pre-sensing step. After being accessed (e.g., selected), a memory cell is read, or sensed, by a current sensor (e.g., sensing circuitry 122) to determine the stored state of the memory cell. For example, a voltage may be applied to the memory cell (using a word line and bit line) and the presence of a resulting current may depend on the applied voltage and the threshold voltage of the memory cell. In some cases, more than one voltage may be applied. Additionally, if an applied voltage does not result in current flow, other voltages may be applied until a current is detected by the current sensor. By assessing the voltage that resulted in current flow, the stored logic state of the memory cell may be determined. In some cases, the voltage may be ramped up in magnitude until a current flow is detected (e.g., a memory cell turns on, switches on, conducts current, or becomes activated). In other cases, predetermined voltages may be applied sequentially until a current is detected. Likewise, a current may be applied to a memory cell, and the magnitude of the voltage to create the current may depend on the electrical resistance or the threshold voltage of the memory cell.

In some cases, the memory cell (e.g., a PCM cell) includes a material that changes its crystallographic configuration (e.g., between a crystalline phase and an amorphous phase), which in turn, determines a threshold voltage of the memory cell to store information. In other cases, the memory cell includes a material that remains in a crystallographic configuration (e.g., an amorphous phase) that may exhibit variable threshold voltages to store information.

The current sensor may include various transistors or amplifiers in order to detect and amplify a difference in the signals. The detected logic state of the memory cell may then be output through a column decoder as output. In some cases, the sense component may be part of a column decoder or a row decoder.

Figure 2:
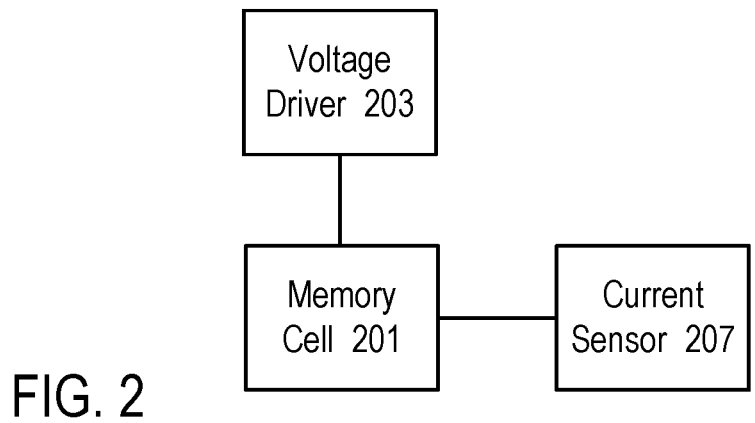
FIG. 2 shows a voltage driver that drives a voltage profile applied to a memory cell, in accordance with some embodiments.

FIG. 2 shows a voltage driver 203 that drives a voltage profile applied to a memory cell 201, in accordance with some embodiments. Voltage driver 203 is configured to drive up the voltage applied on the memory cell 201 during a pre-sensing or pre-read step, as described above. In one embodiment, voltage driver 203 is implemented by multiple voltage drivers. In one example, a portion of the voltage drivers are bit line drivers, and another portion of the voltage drivers are word line drivers. Voltage drivers 203 are an example of bias circuitry 124. Memory cell 201 is an example of memory cell 110, 112.

When a pre-sensing voltage is applied to memory cell 201, current sensor 207 determines a current resulting from applying the pre-sensing voltage. In one example, voltage drivers 203 apply the pre-sensing voltage by driving a bit line to a positive voltage, and a word line to a negative voltage. Voltage drivers 203 can similarly apply a pre-read voltage to memory cell 201. Current sensor 207 is an example of sensing circuitry 122.

After applying the pre-read voltage, when the voltage applied on the memory cell 201 is above the threshold voltage of a programmed cell, the current sensor 207 is configured to determine whether or not the memory cell 201 is conductive, based on the current going through the memory cell 201. If the current sensor 207 detects an amount of current corresponding to a programmed cell, the memory cell 201 is determined to have been programmed to be a SET cell to have a low voltage threshold (corresponding to data that is different from the data represented by a RESET cell that has a high voltage threshold). If the current sensor 207 does not detect the amount of current corresponding to a programmed cell, the memory cell is determined to be a reset cell that corresponds to predetermined data represented by having high voltage thresholds (e.g., cells that have not yet been programmed after a reset or erase operation, or cells that have been programmed to have a high voltage threshold).

Figure 3:
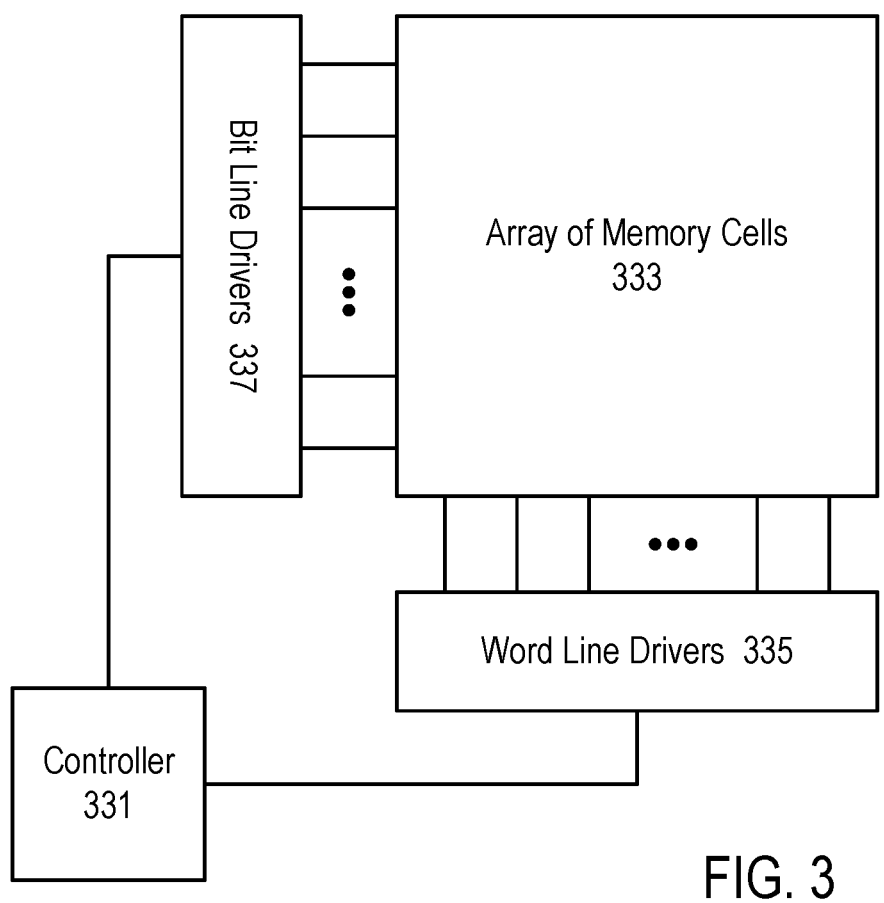
FIG. 3 shows a memory device configured with drivers to implement voltage profiles, in accordance with some embodiments.

FIG. 3 shows a memory device configured with drivers to drive voltages on access lines used to select memory cells in memory array 333, in accordance with some embodiments. For example, memory cell 201 illustrated in FIG. 2 can be used in the memory cell array 333.

The memory device of FIG. 3 includes a controller 331 that operates bit line drivers 337 and word line drivers 335 to access the individual memory cells (e.g., 201) in the array 333. Controller 331 is an example of memory controller 120. Memory array 333 is an example of memory array 102.

The bit line drivers 337 and/or the word line drivers 335 can be implemented by voltage drivers 203 as illustrated in FIG. 2. In one example, each memory cell (e.g., 201) in the array 333 can be accessed via voltages driven by a pair of a bit line driver and a word line driver, as illustrated in FIG. 4.

Figure 4:
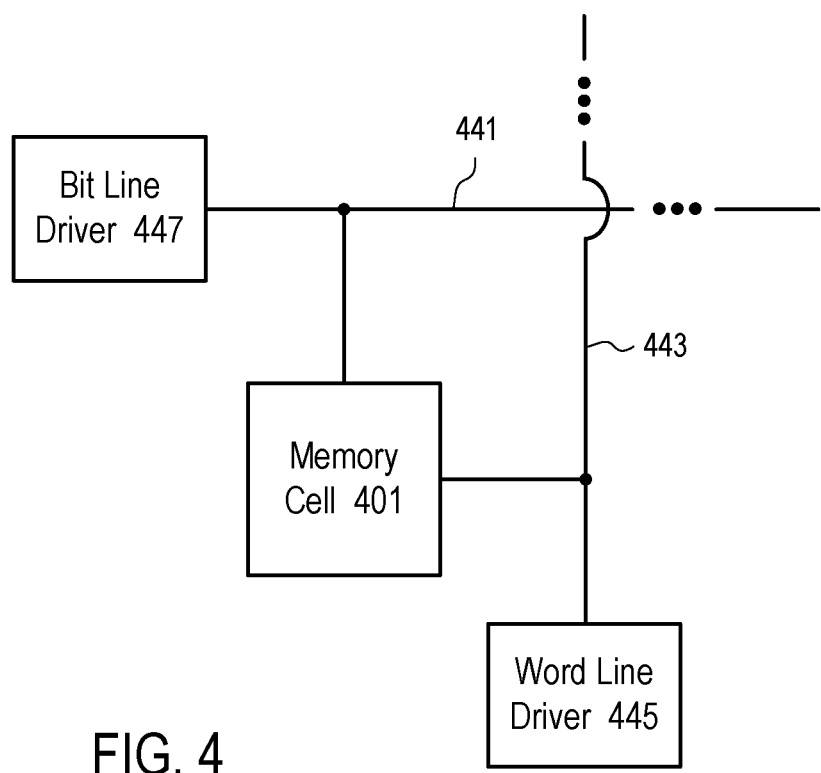
FIG. 4 shows a memory cell with a bit line driver and a word line driver configured to implement voltage profiles, in accordance with some embodiments.

FIG. 4 shows a memory cell 401 with a bit line driver 447 and a word line driver 445 configured to apply voltages to memory cells, in accordance with some embodiments. For example, the bit line driver 447 drives a first voltage applied to a row of memory cells in the array 333; and the word line driver 445 drives a second voltage applied to a column of memory cells in the array 333. A memory cell 401 in the row and column of the memory cell array 333 is subjected to the voltage difference between the first voltage driven by the bit line driver 447 and the second voltage driven by the word line driver 445. When the first voltage is higher than the second voltage, the memory cell 401 is subjected to one voltage polarity (e.g., positive polarity); and when the first voltage is lower than the second voltage, the memory cell 401 is subjected to an opposite voltage polarity (e.g., negative polarity).

For example, when the memory cell 401 is configured to be pre-read with positive voltage polarity, the bit line driver 447 can be configured to drive a positive voltage.

For example, when the memory cell 401 is configured to be pre-read with negative voltage polarity, the word line driver 445 can be configured to drive a positive voltage.

For example, during the write operation, both the bit line driver 447 and the word line driver 445 can drive voltages of differing magnitudes (e.g., to perform pre-sensing, pre-read, and write steps). For example, the bit line driver 447 can be configured to drive a positive voltage with differing magnitudes; and the word line driver 445 can be configured to drive a negative voltage with differing magnitudes. The difference between the voltage driven by the bit line driver 447 and the voltage driven the word line driver 445 corresponds to the voltage applied on the memory cell 401.

In one example, the bit line drivers 337 can be used to drive parallel wires (e.g., 441) arranged in one direction and disposed in one layer of cross point memory; and the word line drivers 435 can be used to drive parallel wires (e.g., 443) arranged in another direction and disposed in another layer of the cross point memory. The wires (e.g., 441) connected to the bit line drivers (e.g., 447) and the wires (e.g., 443) connected to the word line drivers (e.g., 445) run in the two layers in orthogonal directions. The memory cell array 333 is sandwiched between the two layers of wires; and a memory cell (e.g., 401) in the array 333 is formed at a cross point of the two wires (e.g., 441 and 443) in the integrated circuit die of the cross point memory.

Figure 5:
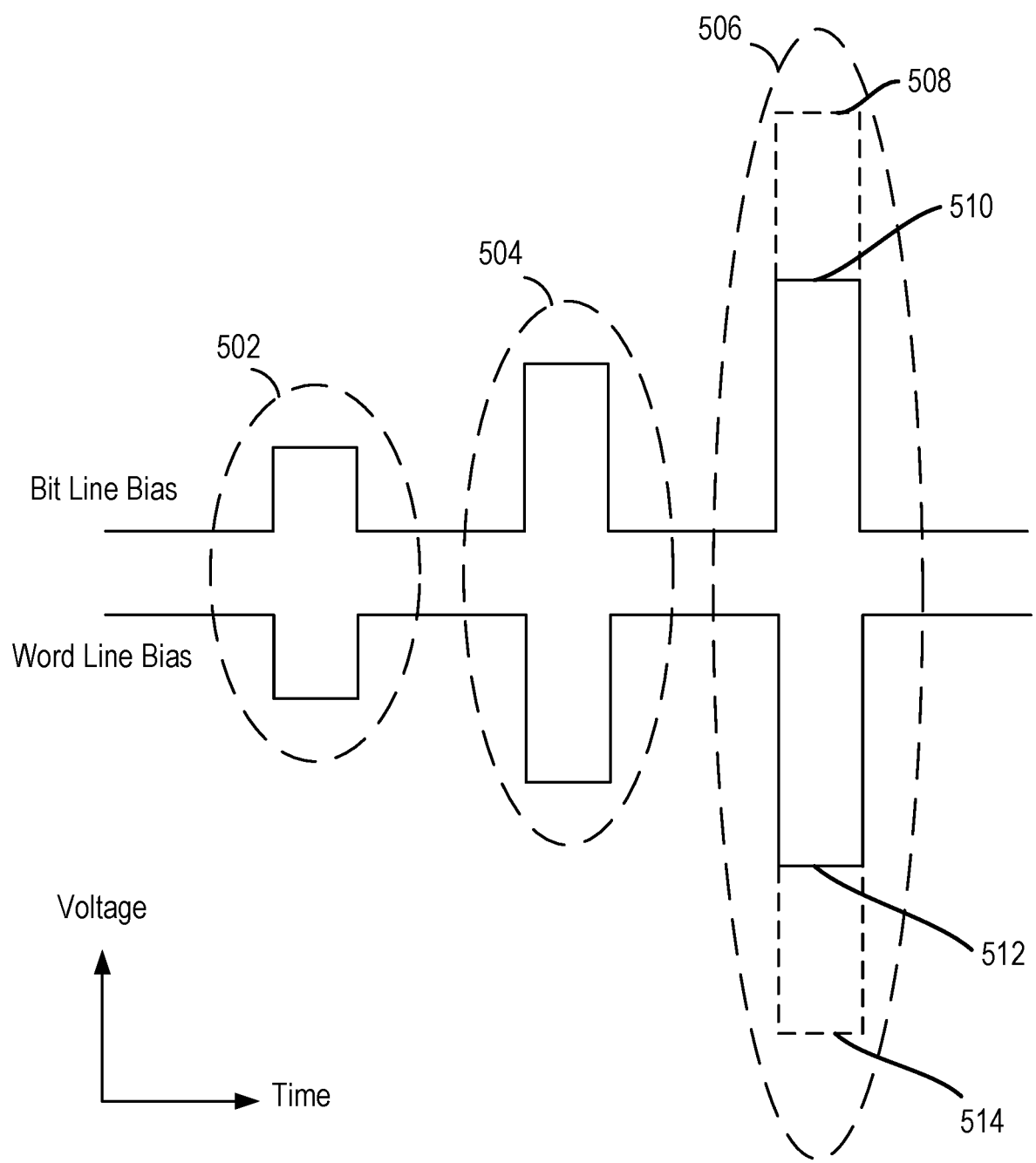
FIG. 5 shows a series of voltage pulses applied to a memory cell, in accordance with some embodiments.

FIG. 5 shows a series of voltage pulses applied to a memory cell, in accordance with some embodiments. In one example, the voltage pulses are applied to memory cell 110, 112 of memory array 102. In one example, the voltage pulses are applied to memory cell 201 or 401. In one example, the voltage pulses are generated by bias circuitry 124. In one example, the voltage pulses are driven by voltage driver 203.

In one embodiment, the voltage pulses include a pre-sensing voltage 502, a pre-read voltage 504, and a write voltage 506. The write voltage 506 can be, for example, a first write voltage or a second write voltage (e.g., as selected by a controller or voltage driver). The first write voltage is a default or normal write voltage. The first write voltage is applied using a bit line bias 510 and a word line bias 512. The second write voltage is a boosted write voltage. The second write voltage is applied using a bit line bias 508 and word line bias 514, so that the overall voltage applied to the memory cell has of greater magnitude.

In one embodiment, a controller selects the first write voltage or the second write voltage based on feedback from applying pre-sensing voltage 502 and pre-read voltage 504 to the memory cell. In one embodiment, the feedback is provided by a current sensor. In one example, the current sensor is current sensor 207. In one example, the controller is memory controller 120, which selects the second write voltage in response to determining that the background is leaky based on feedback from applying pre-sensing voltage 502, and further determining that the memory cell does not snap and is in a RESET state.

In one embodiment, voltage driver selects the first write voltage or the second write voltage based on the feedback. In one example, the voltage driver is voltage driver 203. In one example, the voltage driver is bit line driver 337 and/or word line driver 335. In one example, the voltage driver is implemented in CMOS circuitry underneath the stacked memory array.

In one example, the bit line bias in FIG. 5 is applied by bias circuitry 124 or bit line driver 447. In one example, the word line bias in FIG. 5 is applied by bias circuitry 124 or word line driver 445.

In one embodiment, write voltage 506 is a series of voltage pulses applied to change the voltage of a memory cell. In one example, SET/RESET write pulses are used to crystallize/amorphize the memory cell. In one example the SET/RESET write pulses are used to snap the cell in different polarities for creating different polarization states (e.g., polarization caused by the poling effect).

In one example, a SET on RESET write operation is performed using the series of voltage pulses in FIG. 5, which changes the state of the voltage threshold of the memory cell from high (representing "RESET" to have a bit value of 0) to low (representing "SET" to have a bit value of 1).

In one example, a RESET on SET write operation is performed using the series of voltage pulses in FIG. 5, which causes an opposite change in which the voltage threshold is moved from low (representing "SET" or 1) to high (representing "RESET" or 0).

In one example, other cases may include a RESET on RESET write operation and a SET on SET write operation. In these two cases, there is no significant change to the state of the voltage threshold of the memory cell. The write pulse is generally not used.

In one example, once a memory cell snaps, the current going through the memory cell jumps to a high level; and a high voltage on the memory cell cannot be sustained. The voltage on the memory cell drops (snaps). Once the memory cell snaps, the voltage bias onside (biased on the target bits) drops.

In one embodiment, the write voltage 506 is selected based on the location of the memory cell in the memory array. For example, drift can vary for different regions in the memory array. The magnitude of the boost applied to the write voltage 506 can vary based on the location of the memory cell. In one example, the boost to be applied can be determined by a lookup table in memory of the controller or the voltage driver(s), which defines an extent of boost for each memory array location.

In one embodiment, the write voltage 506 is selected to have a varying magnitude depending on the extent of background leakage as determined from evaluating feedback from pre-sensing voltage 502.

In one embodiment, the write voltage 506 is selected based on an extent of error in operation as determined by the controller. In one example, the controller determines an error rate associated with read and/or write operations. Based on the error rate, the controller can adjust the extent of boost applied to the write voltage 506.

In one example, background leakage is due to a sum of currents of the background memory cells sharing a bit line and/or a word line with a target memory cell. The feedback measured by the current sensor(s) is the sum of these currents. In one example, the current sensors may measure the sum of currents from both the bit line and the word line and add them together, or determine the logical OR of either of these sums as being above a threshold. When the applied voltage is lower than expected thresholds of the memory cell at the bit line and word line, the measurement is dominated by the background leakage (and thus can be considered an indicator of leakiness). When the memory cell snaps at the bit line and word line, the measurement is dominated by the current of the snapped memory cell (and thus can be considered an indicator of the threshold level).

In one example, each bit line and word line applies only a portion (e.g., about half) of the voltage to cause a memory cell to snap. Thus, only the memory cell at the bit line and the word line is selected or "addressed", because other cells sharing the bit line, or the word line would only get a portion of the voltage needed to snap. If a memory cell that is on the same bit line (or word line) is "short" (defective) and snaps at lower than the half voltage, it has a snap current at a low voltage that can contribute to the background leakage.

In one example, when the background is determined to be leaky, it is necessary to apply stronger "force" (higher voltage) to rewrite the state of the memory cell (but this is not necessary if the state of the memory cell is to be remain the same). The other case is that a generally lower voltage for rewrite can be used if the background is not leaky (and thus energy efficient).

In one example, the pre-sensing voltages and pre-read voltages are applied to memory cells 110 or 112 for write operations on memory array 102. In one example, the voltages are generated by bias circuitry 124 as controlled by controller 120. In one example, memory cells 110 are single-level cells (SLCs). In one example, the pre-sensing voltage or the pre-read voltage is a voltage difference applied across a memory cell from a voltage-biased word line and a voltage-biased bit line that are used to select the cell.

In one example, the pre-sensing or pre-read voltages are applied for a time that ranges between 10-100 nanoseconds. In one example, the applied pre-sensing voltage or pre-read voltage is 50-600 millivolts. In one example, the applied voltage is 100-300 millivolts. In one example, the memory cells can be multi-state cells, such as MLC, TLC, etc.

In one embodiment, the programming states of memory cells are determined by applying a pre-read voltage to the memory cells during write operations, in accordance with some embodiments. In one example, the memory cells are memory cells 110, and the pre-read voltages are implemented by memory controller 120.

In one example, a pre-read voltage is applied to a total number of 100 memory cells. A current through each memory cell is sensed by a current sensor (e.g., sense amplifier). Memory cells having a current that exceeds a fixed threshold value are considered to snap. Memory cells having a current that is below the fixed threshold value are considered not to snap.

After determining the existing programming state of each memory cell as discussed above, the memory controller makes a determination of a mode of programming to use for programming the memory cells. In one embodiment, a normal write programming mode is used. In this mode, the controller determines the target state for each memory cell.

In one example of a normal write programming mode, the memory cells are in a reset state. For each such cell that has a target set state, a write voltage is applied to the memory cell. For each such cell that has a target reset state, no write voltage is applied to the cell.

In one embodiment, the controller determines to implement a force write programming mode. In this mode, each memory cell is selected and an appropriate programming write voltage is applied to the memory cell based on the target state. For example, memory cells are programmed to a target reset state even though the memory cells are already in an existing programming reset state.

Figure 6:
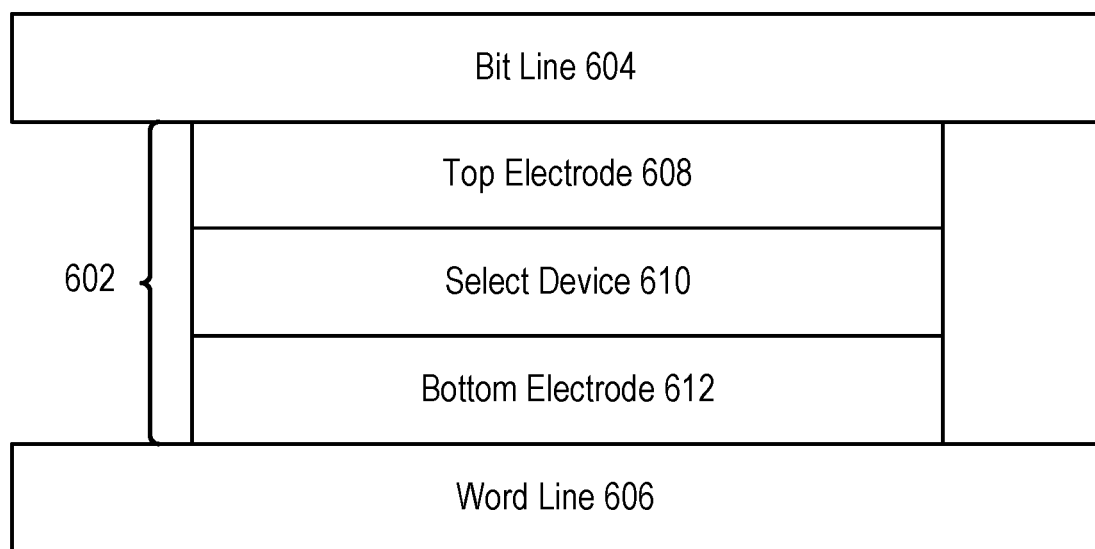
FIG. 6 shows an example of a memory cell that includes a select device, in accordance with some embodiments.

FIG. 6 shows an example of a memory cell 602 that includes a select device 610, in accordance with some embodiments. In one example, select device 610 includes a chalcogenide. Memory cell 602 is an example of memory cells 110, 112.

Top electrode 608 conductively connects select device 610 to bit line 604, and bottom electrode 612 conductively connects select device 610 to word line 606. In one example, electrodes 608, 612 are formed of a carbon material.

In one example, select device 610 includes a chalcogenide (e.g., chalcogenide material and/or chalcogenide alloy). Threshold voltage properties of the select device may be based on the voltage polarities applied to the memory cell.

In one example, a logic state may be written to memory cell 602, which may correspond to one or more bits of data. A logic state may be written to the memory cell by applying voltages of different polarities at different voltage and/or current magnitudes. The memory cell may be read by applying voltages of a single polarity. The writing and reading protocols may take advantage of different threshold voltages of the select device that result from the different polarities. In one example, the memory cell may require short, relatively low power pulses to read. The chalcogenide material of the select device may or may not undergo a phase change during reading and/or writing. In some cases, the chalcogenide material may not be a phase change material.

Figure 7:
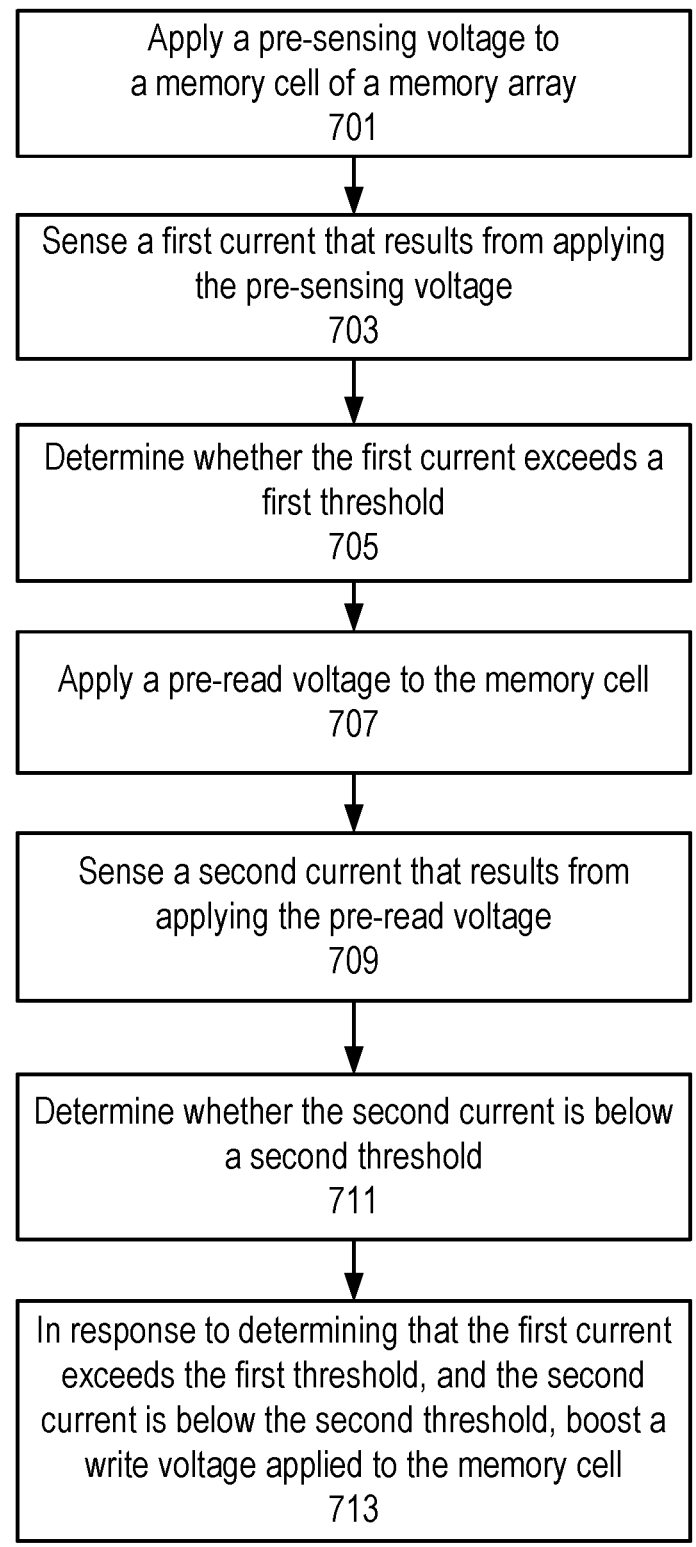
FIG. 7 shows a method for evaluating background leakage to select write voltages for applying to a memory cell when performing a write operation, in accordance with some embodiments.

FIG. 7 shows a method for evaluating background leakage to select write voltages for applying to a memory cell when performing a write operation, in accordance with some embodiments. For example, the method of FIG. 7 can be implemented in the system of FIG. 1. In one example, memory controller 120 evaluates background leakage (e.g., by applying one or more pre-sensing voltages to different memory cells and monitoring the feedback currents using sensing circuitry 122) to select write voltages to apply to memory cells 110 when performing write operations.

The method of FIG. 7 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 7 is performed at least in part by one or more processing devices (e.g., processing device 116 of FIG. 1) and/or one or more voltage drivers (e.g., voltage driver 203 of FIG. 2).

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 701, a pre-sensing voltage is applied to a memory cell of a memory array. In one example, the pre-sensing voltage is pre-sensing voltage 502. In one example, the memory cell is memory cell 201.

At block 703, a first current that results from applying the pre-sensing voltage is sensed. In one example, the first current is measured by current sensor 207.

At block 705, a determination is made whether the first current exceeds a first threshold. In one example, the determination is made by memory controller 120 and/or logic in voltage driver 203.

At block 707, a pre-read voltage is applied to the memory cell. In one example, the pre-read voltage is pre-read voltage 504.

At block 709, a second current that results from applying the pre-read voltage is sensed. In one example, the second current is measured by current sensor 207 (or a current sensor that is different from the current sensor that measures the first current).

At block 711, a determination is made whether the second current is below a second threshold. In one example, the determination is made by memory controller 120 and/or logic in voltage driver 203.

At block 713, in response to determining that the first current exceeds the first threshold, and a second current is below the second threshold, a write voltage applied to the memory cell is boosted. In one example, memory controller 120 selects a boosted write voltage 506. In one example, the boosted write voltage is applied using voltages 508, 514.

In one embodiment, a system includes: a memory array (e.g., 102, 333) including memory cells; and a controller (e.g., 120) configured to: program each of the memory cells by applying a first write voltage (e.g., a default or normal write voltage 510, 512) or a second write voltage (e.g., boosted write voltage 508, 514) to the respective memory cell, where the second write voltage is greater than the first write voltage; apply a pre-sensing voltage to a first memory cell of the memory array; sense a first current that results from applying the pre-sensing voltage; determine whether the first current exceeds a first threshold; apply a pre-read voltage to the first memory cell; sense a second current that results from applying the pre-read voltage; and determine whether the second current is below a second threshold, where the second threshold is greater than the first threshold. In response to determining that the first current exceeds the first threshold (e.g., background is potentially leaky), and determining that the second current is below the second threshold (e.g., cell does not snap and is in RESET state), the first memory cell is programmed by applying the second write voltage.

In one embodiment, the first memory cell is in a first logic state corresponding to a first threshold voltage (e.g., RESET with high Vt), programming the first memory cell includes programming the first memory cell to a second logic state corresponding to a second threshold voltage (e.g., SET with low Vt), and the second threshold voltage is lower than the first threshold voltage.

In one embodiment, the pre-read voltage is a first pre-read voltage, and the controller is further configured to: apply a pre-sensing voltage to a second memory cell; sense a third current that results from applying the pre-sensing voltage to the second memory cell; determine whether the third current exceeds the first threshold (e.g., determine if background for second cell is leaky); apply a second pre-read voltage to the second memory cell; sense a fourth current that results from applying the second pre-read voltage to the second memory cell; and determine whether the fourth current is below the second threshold (e.g., determine if second cell has snapped). In response to determining that the third current exceeds the first threshold (e.g., background was flagged as potentially leaky), and determining that the fourth current is not below the second threshold (e.g., cell snaps and is in SET state), the second memory cell is programmed by applying the first write voltage (e.g., no boost in write voltage).

In one embodiment, the second memory cell is in a first logic state corresponding to a first threshold voltage (e.g., SET with low Vt), programming the second memory cell includes programming the second memory cell to a second logic state corresponding to a second threshold voltage (e.g., RESET with high Vt), and the second threshold voltage is greater than the first threshold voltage.

In one embodiment, the controller is further configured to: apply a pre-sensing voltage to a third memory cell; sense a fifth current that results from applying the pre-sensing voltage to the third memory cell; determine whether the fifth current exceeds the first threshold (e.g., determine if background for third cell is leaky); and in response to determining that the fifth current does not exceed the first threshold (e.g., background is not leaky), program the third memory cell by applying the first write voltage (e.g., no boost in write voltage).

In one embodiment, the controller is further configured to: apply a third pre-read voltage to the third memory cell to determine that the third memory cell is in a first logic state (e.g., SET or RESET). Programming the third memory cell includes programming the third memory cell to a second logic state that is opposite to the first logic state.

In one embodiment, the first memory cell includes chalcogenide, a top electrode above the chalcogenide, and a bottom electrode below the chalcogenide.

In one embodiment, the pre-sensing voltage has a same polarity as the second write voltage.

In one embodiment, the pre-sensing voltage and the pre-read voltage are applied to the first memory cell as part of a programming operation, and the programming operation is performed in response to the controller receiving a write command from a host device.

In one embodiment, the pre-read voltage is applied to determine an existing logic state (e.g., RESET) of the first memory cell, and the controller is further configured to compare a target logic state (e.g., SET) of the first memory cell to the existing logic state. Programming the first memory cell is further in response to determining that the target logic state is different from the existing logic state.

In one embodiment, the target logic state corresponds to a write command received from a host device (e.g., host requests storing data in SET state instead of RESET state).

In one embodiment, the first threshold is 25 microamps, and the second write voltage is greater than the first write voltage by at least 200 millivolts.

In one embodiment, the controller is further configured to, when programming the first memory cell, select a magnitude of the second write voltage based on a magnitude of the first current.

In one embodiment, the controller is further configured to: determine an error rate associated with reading data from the memory cells; and when programming the first memory cell, select a magnitude of the second write voltage based on the error rate.

In one embodiment, a method includes: programming each of a plurality of memory cells in a memory array by applying a first write voltage (e.g., default write voltage) or a second write voltage (e.g., boost write voltage) to the respective memory cell, where the second write voltage is greater than the first write voltage; applying a pre-sensing voltage to a first memory cell of the memory array; sensing a first current that results from applying the pre-sensing voltage; determining whether the first current exceeds a first threshold (e.g., determine if background is leaky); applying a pre-read voltage to the first memory cell; sensing a second current that results from applying the pre-read voltage; and determining whether the second current is below a second threshold, where the second threshold is greater than the first threshold (e.g., determine if cell snaps). In response to determining that the first current exceeds the first threshold (e.g., background is leaky), and determining that the second current is below the second threshold (e.g., cell does not snap and is in SET state), the first memory cell is programmed by applying the second write voltage (e.g., write cell to RESET state), where the applied second write voltage has an opposite polarity to the pre-read voltage.

In one embodiment, the pre-sensing voltage has a same polarity as the second write voltage applied to the first memory cell.

In one embodiment, the pre-read voltage is a first pre-read voltage; and the first pre-read voltage and the second write voltage are applied to the first memory cell as part of a first programming operation performed in response to a first write command received by a controller from a host device. The method further includes: receiving, by the controller, a second write command from the host device; and in response to receiving the second write command, performing a second programming operation for a second memory cell including applying a second pre-read voltage to the second memory cell, and applying the first write voltage to the second memory cell.

In one embodiment, each memory cell in the memory array is a chalcogenide memory cell; and a controller is configured to apply the second write voltage with a first polarity to program the respective memory cell to a first logic state (e.g., SET or RESET state), and with a second opposite polarity to program the respective memory cell to a second logic state (e.g., opposite of first logic state).

In one embodiment, the pre-sensing voltage is a first pre-sensing voltage, and the pre-read voltage is a first pre-read voltage. The method further includes: applying a second pre-sensing voltage to a second memory cell of the memory array; sensing a third current that results from applying the second pre-sensing voltage; determining that the third current exceeds a third threshold (e.g., set flag that background for second cell is potentially leaky); applying a second pre-read voltage to the second memory cell; sensing a fourth current that results from applying the second pre-read voltage; and determining that the fourth current is above a fourth threshold (e.g., the second cell snaps). In response to determining that the third current exceeds the third threshold (e.g., flag is set), and determining that the fourth current is above the fourth threshold (e.g., second cell snaps and is in RESET state), the second memory cell is programmed by applying the first write voltage (e.g., no boost in write voltage).

In one embodiment, a system includes: a memory array including a memory cell; and at least one voltage driver connected to the memory cell and configured to: drive a pre-sensing voltage on the memory cell during an operation to program the memory cell; after driving the pre-sensing voltage, drive a pre-read voltage on the memory cell during the operation; and after driving the pre-read voltage, select a first write voltage (e.g., default write voltage) or a second write voltage (e.g., boost write voltage) to drive on the memory cell during the operation, where the second write voltage is greater than the first write voltage. The system further includes at least one current sensor connected to the memory cell and configured to: determine whether a first current that results from driving the pre-sensing voltage exceeds a first threshold; and determine whether a second current that results from driving the pre-read voltage is below a second threshold. In response to determining that the first current exceeds the first threshold (e.g., background is leaky), and determining that the second current is below the second threshold (e.g., cell does not snap and is in RESET state), the voltage driver selects the second write voltage to drive on the memory cell.

The disclosure includes various devices which perform the methods and implement the systems described above, including data processing systems which perform these methods, and computer-readable media containing instructions which when executed on data processing systems cause the systems to perform these methods.

The description and drawings are illustrative and are not to be construed as limiting. Numerous specific details are described to provide a thorough understanding. However, in certain instances, well-known or conventional details are not described in order to avoid obscuring the description. References to one or an embodiment in the present disclosure are not necessarily references to the same embodiment; and, such references mean at least one.

As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

In this description, various functions and/or operations may be described as being performed by or caused by software code to simplify description. However, those skilled in the art will recognize what is meant by such expressions is that the functions and/or operations result from execution of the code by one or more processing devices, such as a microprocessor, Application-Specific Integrated Circuit (ASIC), graphics processor, and/or a Field-Programmable Gate Array (FPGA). Alternatively, or in combination, the functions and operations can be implemented using special purpose circuitry (e.g., logic circuitry), with or without software instructions. Embodiments can be implemented using hardwired circuitry without software instructions, or in combination with software instructions. Thus, the techniques are not limited to any specific combination of hardware circuitry and software, nor to any particular source for the instructions executed by a computing device.

While some embodiments can be implemented in fully functioning computers and computer systems, various embodiments are capable of being distributed as a computing product in a variety of forms and are capable of being applied regardless of the particular type of computer-readable medium used to actually effect the distribution.

At least some aspects disclosed can be embodied, at least in part, in software. That is, the techniques may be carried out in a computing device or other system in response to its processing device, such as a microprocessor, executing sequences of instructions contained in a memory, such as ROM, volatile RAM, non-volatile memory, cache or a remote storage device.

Routines executed to implement the embodiments may be implemented as part of an operating system, middleware, service delivery platform, SDK (Software Development Kit) component, web services, or other specific application, component, program, object, module or sequence of instructions (sometimes referred to as computer programs). Invocation interfaces to these routines can be exposed to a software development community as an API (Application Programming Interface). The computer programs typically comprise one or more instructions set at various times in various memory and storage devices in a computer, and that, when read and executed by one or more processors in a computer, cause the computer to perform operations necessary to execute elements involving the various aspects.

A computer-readable medium can be used to store software and data which when executed by a computing device causes the device to perform various methods. The executable software and data may be stored in various places including, for example, ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a computer-readable medium in entirety at a particular instance of time.

Examples of computer-readable media include, but are not limited to, recordable and non-recordable type media such as volatile and non-volatile memory devices, read only memory (ROM), random access memory (RAM), flash memory devices, solid-state drive storage media, removable disks, magnetic disk storage media, optical storage media (e.g., Compact Disk Read-Only Memory (CD ROMs), Digital Versatile Disks (DVDs), etc.), among others. The computer-readable media may store the instructions. Other examples of computer-readable media include, but are not limited to, non-volatile embedded devices using NOR flash or NAND flash architectures. Media used in these architectures may include un-managed NAND devices and/or managed NAND devices, including, for example, eMMC, SD, CF, UFS, and SSD.

In general, a non-transitory computer-readable medium includes any mechanism that provides (e.g., stores) information in a form accessible by a computing device (e.g., a computer, mobile device, network device, personal digital assistant, manufacturing tool having a controller, any device with a set of one or more processors, etc.). A "computer-readable medium" as used herein may include a single medium or multiple media (e.g., that store one or more sets of instructions).

In various embodiments, hardwired circuitry may be used in combination with software and firmware instructions to implement some of the techniques. Thus, the techniques are neither limited to any specific combination of hardware circuitry and software nor to any particular source for the instructions executed by a computing device.

Various embodiments set forth herein can be implemented using a wide variety of different types of computing devices. As used herein, examples of a "computing device" include, but are not limited to, a server, a centralized computing platform, a system of multiple computing processors and/or components, a mobile device, a user terminal, a vehicle, a personal communications device, a wearable digital device, an electronic kiosk, a general purpose computer, an electronic document reader, a tablet, a laptop computer, a smartphone, a digital camera, a residential domestic appliance, a television, or a digital music player. Additional examples of computing devices include devices that are part of what is called "the internet of things" (IOT). Such "things" may have occasional interactions with their owners or administrators, who may monitor the things or modify settings on these things. In some cases, such owners or administrators play the role of users with respect to the "thing" devices. In some examples, the primary mobile device (e.g., an Apple iPhone) of a user may be an administrator server with respect to a paired "thing" device that is worn by the user (e.g., an Apple watch).

In some embodiments, the computing device can be a computer or host system, which is implemented, for example, as a desktop computer, laptop computer, network server, mobile device, or other computing device that includes a memory and a processing device. The host system can include or be coupled to a memory sub-system so that the host system can read data from or write data to the memory sub-system. The host system can be coupled to the memory sub-system via a physical host interface. In general, the host system can access multiple memory sub-systems via a same communication connection, multiple separate communication connections, and/or a combination of communication connections.

In one example, the host system is host device 126. In one example, the memory sub-system is memory device 101.

In some embodiments, the computing device is a system including one or more processing devices. Examples of the processing device can include a microcontroller, a central processing unit (CPU), special purpose logic circuitry (e.g., a field programmable gate array (FPGA), an application specific integrated circuit (ASIC), etc.), a system on a chip (SoC), or another suitable processor.

In one example, a computing device is a controller of a memory system. The controller includes a processing device and memory containing instructions executed by the processing device to control various operations of the memory system.

Although some of the drawings illustrate a number of operations in a particular order, operations which are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A system comprising:
a memory array including memory cells; and
a controller configured to:
program each of the memory cells by applying a first write voltage or a second write voltage to the respective memory cell, wherein the second write voltage is greater than the first write voltage;
apply a pre-sensing voltage to a first memory cell of the memory array;
sense a first current that results from applying the pre-sensing voltage;
determine whether the first current exceeds a first threshold;
apply a pre-read voltage to the first memory cell;
sense a second current that results from applying the pre-read voltage;
determine whether the second current is below a second threshold, wherein the second threshold is greater than the first threshold; and
in response to determining that the first current exceeds the first threshold, and determining that the second current is below the second threshold, program the first memory cell by applying the second write voltage.

2. The system of claim 1, wherein the first memory cell is in a first logic state corresponding to a first threshold voltage, programming the first memory cell comprises programming the first memory cell to a second logic state corresponding to a second threshold voltage, and the second threshold voltage is lower than the first threshold voltage.

3. The system of claim 1, wherein the pre-read voltage is a first pre-read voltage, and the controller is further configured to:
apply a pre-sensing voltage to a second memory cell;
sense a third current that results from applying the pre-sensing voltage to the second memory cell;
determine whether the third current exceeds the first threshold;
apply a second pre-read voltage to the second memory cell;
sense a fourth current that results from applying the second pre-read voltage to the second memory cell;
determine whether the fourth current is below the second threshold; and
in response to determining that the third current exceeds the first threshold, and determining that the fourth current is not below the second threshold, program the second memory cell by applying the first write voltage.

4. The system of claim 3, wherein the second memory cell is in a first logic state corresponding to a first threshold voltage, programming the second memory cell comprises programming the second memory cell to a second logic state corresponding to a second threshold voltage, and the second threshold voltage is greater than the first threshold voltage.

5. The system of claim 3, wherein the controller is further configured to:
apply a pre-sensing voltage to a third memory cell;
sense a fifth current that results from applying the pre-sensing voltage to the third memory cell;
determine whether the fifth current exceeds the first threshold; and
in response to determining that the fifth current does not exceed the first threshold, program the third memory cell by applying the first write voltage.

6. The system of claim 5, wherein the controller is further configured to:
apply a third pre-read voltage to the third memory cell to determine that the third memory cell is in a first logic state;
wherein programming the third memory cell comprises programming the third memory cell to a second logic state that is opposite to the first logic state.

7. The system of claim 1, wherein the first memory cell comprises chalcogenide, a top electrode above the chalcogenide, and a bottom electrode below the chalcogenide.

8. The system of claim 1, wherein the pre-sensing voltage has a same polarity as the second write voltage.

9. The system of claim 1, wherein the pre-sensing voltage and the pre-read voltage are applied to the first memory cell as part of a programming operation, and the programming operation is performed in response to the controller receiving a write command from a host device.

10. The system of claim 1, wherein the pre-read voltage is applied to determine an existing logic state of the first memory cell, and the controller is further configured to:
compare a target logic state of the first memory cell to the existing logic state;
wherein programming the first memory cell is further in response to determining that the target logic state is different from the existing logic state.

11. The system of claim 10, wherein the target logic state corresponds to a write command received from a host device.

12. The system of claim 1, wherein the first threshold is 25 microamps, and the second write voltage is greater than the first write voltage by at least 200 millivolts.

13. The system of claim 1, wherein the controller is further configured to, when programming the first memory cell, select a magnitude of the second write voltage based on a magnitude of the first current.

14. The system of claim 1, wherein the controller is further configured to:
determine an error rate associated with reading data from the memory cells; and
when programming the first memory cell, select a magnitude of the second write voltage based on the error rate.

15. A method comprising:
programming each of a plurality of memory cells in a memory array by applying a first write voltage or a second write voltage to the respective memory cell, wherein the second write voltage is greater than the first write voltage;
applying a pre-sensing voltage to a first memory cell of the memory array;
sensing a first current that results from applying the pre-sensing voltage;
determining whether the first current exceeds a first threshold;
applying a pre-read voltage to the first memory cell;
sensing a second current that results from applying the pre-read voltage;
determining whether the second current is below a second threshold, wherein the second threshold is greater than the first threshold; and
in response to determining that the first current exceeds the first threshold, and
determining that the second current is below the second threshold,
programming the first memory cell by applying the second write voltage,
wherein the applied second write voltage has an opposite polarity to the pre-read voltage.

16. The method of claim 15, wherein the pre-sensing voltage has a same polarity as the second write voltage applied to the first memory cell.

17. The method of claim 15, wherein:
the pre-read voltage is a first pre-read voltage;
the first pre-read voltage and the second write voltage are applied to the first memory cell as part of a first programming operation performed in response to a first write command received by a controller from a host device; and
the method further comprises:
receiving, by the controller, a second write command from the host device; and
in response to receiving the second write command, performing a second programming operation for a second memory cell including applying a second pre-read voltage to the second memory cell, and applying the first write voltage to the second memory cell.

18. The method of claim 15, wherein:
each memory cell in the memory array is a chalcogenide memory cell; and
a controller is configured to apply the second write voltage with a first polarity to program the respective memory cell to a first logic state, and with a second opposite polarity to program the respective memory cell to a second logic state.

19. The method of claim 15, wherein the pre-sensing voltage is a first pre-sensing voltage, and the pre-read voltage is a first pre-read voltage, the method further comprising:
applying a second pre-sensing voltage to a second memory cell of the memory array;
sensing a third current that results from applying the second pre-sensing voltage;
determining that the third current exceeds a third threshold;
applying a second pre-read voltage to the second memory cell;
sensing a fourth current that results from applying the second pre-read voltage;
determining that the fourth current is above a fourth threshold; and
in response to determining that the third current exceeds the third threshold, and determining that the fourth current is above the fourth threshold, programming the second memory cell by applying the first write voltage.

20. A system comprising:
a memory array including a memory cell;
at least one voltage driver connected to the memory cell and configured to:
drive a pre-sensing voltage on the memory cell during an operation to program the memory cell;
after driving the pre-sensing voltage, drive a pre-read voltage on the memory cell during the operation; and
after driving the pre-read voltage, select a first write voltage or a second write voltage to drive on the memory cell during the operation, wherein the second write voltage is greater than the first write voltage; and
at least one current sensor connected to the memory cell and configured to:
determine whether a first current that results from driving the pre-sensing voltage exceeds a first threshold; and determine whether a second current that results from driving the pre-read voltage is below a second threshold;

wherein in response to determining that the first current exceeds the first threshold, and determining that the second current is below the second threshold, the voltage driver selects the second write voltage to drive on the memory cell.

* * * * *